United States Patent [19]
Wu

[11] Patent Number: 5,946,580
[45] Date of Patent: Aug. 31, 1999

[54] METHOD TO FORM ELEVATED SOURCE/ DRAIN WITH SOLID PHASE DIFFUSED SOURCE/DRAIN EXTENSION FOR MOSFET

[75] Inventor: Shye-Lin Wu, Hsinchu, Taiwan

[73] Assignee: Texas Instruments—Acer Incorporated, Hsinchu, Taiwan

[21] Appl. No.: 09/013,429

[22] Filed: Jan. 26, 1998

[51] Int. Cl.[6] ............................................. H01L 21/336
[52] U.S. Cl. ..................... 438/303; 438/304; 438/305; 438/563; 438/595; 438/596
[58] Field of Search ................................ 438/303, 304, 438/305, 563, 595, 596

[56] References Cited

U.S. PATENT DOCUMENTS 5,200,352  4/1993  Pfiester ................................. 438/231

OTHER PUBLICATIONS

Kiyoshi Takeuchi et al., *High Performance Sub–tenth Micron CMOS Using Advanced Boron Doping and WSI₂ Dual Gate Process*, 1995, pp. 9–10.

Shye Lin Wu et al., *Supression of Boron Penetration into an Ultra–Thin Gate Oxide (≦ 7nm) by Using a Stacked–Amorphous–Silicon (SAS) Film*, 1993 IEEE, pp. 329–332.

T.P. Ong et al., *CVD SiN$_x$ Anti–reflective Coating for Sub–/.5μm Lithography*, 1995, pp. 73–74.

Tan Fu Lei et al., *Low–Temperature Growth of Silicon–Boron Layer as Solid Diffusion Source for Polysilicon Contacted p⁺–n Shallow Junction*, 1995 IEEE, pp. 2104–2110.

*Primary Examiner*—John F. Niebling
*Assistant Examiner*—Lynne A. Gurley
*Attorney, Agent, or Firm*—Harness, Dickey & Pierce, P.L.C.

[57] ABSTRACT

A gate insulator layer is formed over the semiconductor substrate and a first silicon layer is then formed over the gate insulator layer. An anti-reflection layer is formed over the first silicon layer. A gate region is defined by removing a portion of the gate insulator layer, a portion of the first silicon layer, and a portion of the anti-reflection layer. A shield layer is then formed over the semiconductor substrate, on the gate insulator layer, and on the first silicon layer. A spacer structure containing first conductivity type dopants is then formed on the gate region. Following the removal of the anti-reflection layer, a second silicon layer containing second conductivity type dopants is formed over the semiconductor substrate and the first silicon layer. Finally, a thermal process is performed to the semiconductor substrate for diffusing the first conductivity type dopants and the second conductivity type dopants into the semiconductor substrate.

20 Claims, 2 Drawing Sheets

METHOD TO FORM ELEVATED SOURCE/DRAIN WITH SOLID PHASE DIFFUSED SOURCE/DRAIN EXTENSION FOR MOSFET

FIELD OF THE INVENTION

The present invention relates to the manufacturing of transistors in the semiconductor fabrication, and more specifically, to a method of forming an elevated source/drain with solid phase diffused source/drain extension for metal oxide semiconductor field effect transistors (MOSFETs).

BACKGROUND OF THE INVENTION

From the first invention of integrated circuits in 1960, the number of devices on a chip has grown at an explosively increasing rate. The technologies of the semiconductor industry have been researched continuously for almost four decades. The progress of the semiconductor integrated circuits has entered the ULSI (ultra large scale integration) level or even higher a level. The capacity of a single semiconductor chip increases from several thousand devices to hundreds of million devices, or even billions of devices. The integrated circuit devices like transistors, capacitors, and connections must be greatly narrowed simultaneously. The increasing packing density of the integrated circuits generates numerous challenges to the semiconductor manufacturing process. Every device needs to be formed within a smaller size without damaging the characteristics and the operations. The demands on high packing density, low heat generating, and low power consumption devices with good reliability and long operation life must be maintained without any degradation in their functions. These achievements are expected to be reached with the five key aspects of the semiconductor manufacturing, including the photography, the etching, the deposition, the ion implantation, and the thermal processing technologies. The continuous increase in the packing density of the integration circuits must be accompanied with a smaller feature size. With the present semiconductor manufacturing technology, the processes with generally a quarter micrometer in size is widely utilized. For making the next generation devices, the technologies focusing mainly on one-tenth micrometer and even nanometer feature sizes are highly required.

Transistors, or more particularly the metal oxide semiconductor field effect transistors (MOSFET), are the most important and frequently employed devices. The MOSFET is widely employed in the integrated circuits with its high performance. However, with the continuous narrowing of device size, the sub-micron scale MOS transistors have to face many risky challenges. As the MOS transistors become narrower and thinner accompanying shorter channels, problems like junction punchthrough, leakage, and contact resistance cause the reduction in the yield and compromise the reliability of the semiconductor manufacturing processes.

For developing future MOS devices with a sub-micrometer or even smaller feature size, the ultra shallow junctions are required to suppress the short channel effects encountered with the down scaled sizes. On the other hand, new challenges arise with a narrowed size. The preparation of an extremely shallow source/drain junction is much harder. The conventional ion implantation process is unable to form a shallow junction with high dopant concentration. In the work proposed by K. Takeuchi et al. ("High performance sub-tenth micron CMOS using advanced boron doping and WSi$_2$ dual gate process", appearing in 1995 Symposium on VLSI Technology Digest of Technical Papers), the problem is addressed. The ion implantation has difficulty in forming shallow and high concentration source/drain. The defect-induced anomalous diffusion of boron in the channel region becomes a problem. Local boron depletion near the source/drain junctions will directly enhance short channel effects. A CMOS fabrication method is also disclosed in this work.

In addition, a device degradation problem is found to come from the boron penetration into the thin gate oxide with the formation of a doped polysilicon gate. S. L. Wu (the inventor of the present invention), C. L. Lee, and T. F. Lai consider the problem in their work "Suppression of Boron Penetration into an Ultra-Thin Gate Oxide ($\leq 7$ nm) by Using a Stacked-Amorphous-Silicon (SAS) Film" (IEDM 93–329, 1993 IEEE). The p+ polysilicon has been widely used as the gate material in pMOSFET, to avoid short-channel effects. The BF$_2$-implant is typically used in forming both the gate and the junction. However, the F-incorporation will enhance the boron penetration through the thin gate oxide into the silicon substrate. The penetration also results in a large threshold voltage shift. A SAS gate structure is proposed to suppress the F-incorporation-induced boron penetration effect in their work.

SUMMARY OF THE INVENTION

A method of forming an elevated source/drain with solid phase diffused source/drain extension for metal oxide semiconductor field effect transistors (MOSFETs) is provided in the present invention. The short channel effects can be suppressed by using an elevated junction. The boron penetration problem is minimized by the protection of a shield layer. An extended ultra-shallow source/drain junction is formed by using a spacer structure as a diffusion source. The effects accompanying the small feature size devices are eliminated by the extended ultra-shallow junction.

The method of the present invention in forming a transistor, more specifically a MOSFET, on a semiconductor substrate includes the following steps. A gate insulator layer is formed over the semiconductor substrate and a first silicon layer is then formed over the gate insulator layer. An anti-reflection layer is formed over the first silicon layer. A gate region is defined by removing a portion of the gate insulator layer of the first silicon layer and of the anti-reflection layer. A shield layer is then formed over the semiconductor substrate, on the gate insulator layer, and on the first silicon layer. A spacer structure containing first conductivity type dopants is then formed on the gate region. Following the removal of the anti-reflection layer, a second silicon layer containing second conductivity type dopants is formed over the semiconductor substrate and the first silicon layer. Finally, a thermal process is performed to the semiconductor substrate for diffusing the first conductivity type dopants and the second conductivity type dopants into the semiconductor substrate.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method of forming an elevated source/drain with solid phase diffused source/drain extension for metal oxide semiconductor field effect transistors (MOSFETs) is provided in the present invention. An elevated source/drain junction is formed through the deposition of a second silicon layer as a diffusion source. The short channel effects is suppressed by using the elevated junction. A stacked silicon layer structure is utilized as the gate structure. The boron penetration problem is minimized with the protection of a shield layer. An extended ultra-shallow source/drain junction is formed by using a spacer structure as a diffusion source. The hot electron effect is eliminated by the extended ultra-shallow junction.

Figure 1:
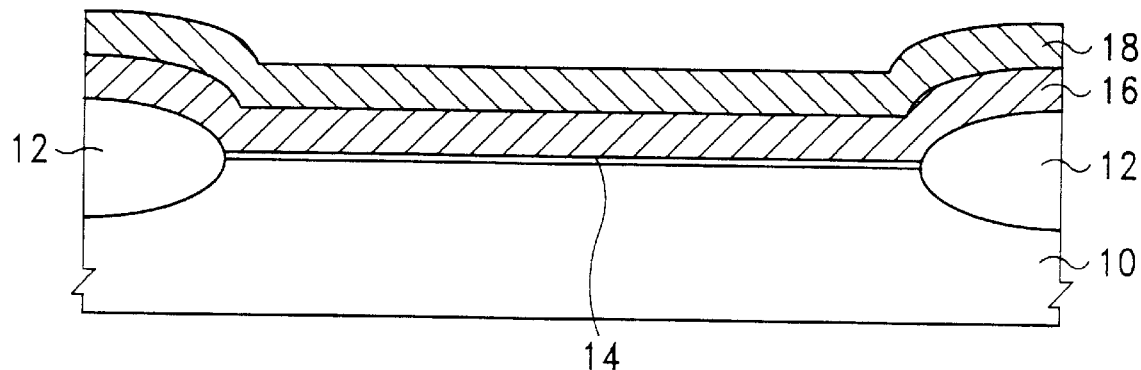
FIG. 1 illustrates a cross-sectional view of the formation of a gate insulator layer, a first silicon layer, and an anti-reflection layer over the semiconductor substrate in the present invention.

The method and the steps in the present invention applied on a semiconductor wafer can create different types of transistors and numerous devices at a time. For a clear illustration, the steps for forming mainly a single PMOS transistor are illustrated. Since the variations in the processes for incorporating the formation of the other types of transistors are well known in the art, the details are not described. Referring to FIG. 1, a semiconductor substrate 10 with a preferable single crystalline silicon in a <100> direction is provided. An isolation region using field oxide isolation 12 or other isolation technology like trench isolation (not shown) is formed on the semiconductor substrate 10. A gate insulator layer 14, like an oxide layer, is formed. The oxide layer 14 can be grown thermally in an oxygen containing ambient. The oxide layer 14 is grown from the semiconductor substrate 10 with a thickness ranging from about 15 angstroms to 300 angstroms.

A first silicon layer 16 is then formed over the oxide layer 14. Preferably, an undoped polysilicon layer can be deposited as the first silicon layer 16. The undoped polysilicon layer 16 can be formed by chemical vapor deposition with a thickness of about 300 angstroms to 2000 angstroms. The forming of the undoped polysilicon layer 16 subsequently over the oxide layer 14 eliminates the problem of the oxide degradation from the penetration of ions. An anti-reflection layer 18 is formed over the undoped polysilicon layer. The anti-reflection layer 18 effectively reduces the unwanted reflections in the lithography process and increases the accuracy of the pattern transfer. One choice of the anti-reflection layer 18 is a nitride layer formed by a chemical vapor deposition process. The anti-reflection characteristic of the nitride layer 18 is nominated in the work of T. P. Ong et al. ("CVD SiNx Anti-reflective Coating for Sub-0.5 µm Lithography", 1995 Symposium on VLSI Technology Digest of Technical Papers) The integration of a LPCVD (low pressure chemical vapor deposition) silicon-rich nitride film as a bottom anti-reflective coating (BARC) is recommended in this work. Their integration has been successfully demonstrated for deep-UV lithography according to the details proposed in the article.

Figure 2:
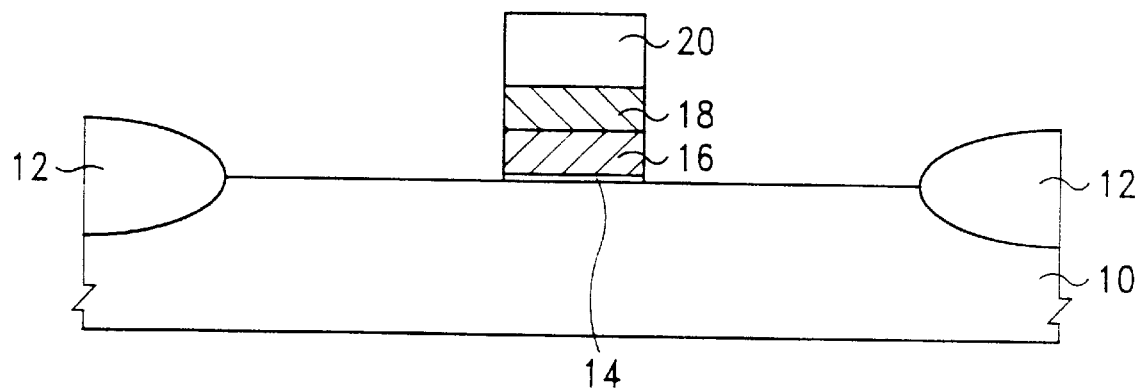
FIG. 2 illustrates a cross-sectional view of defining a gate region over the semiconductor substrate in the present invention.
Figure 3:
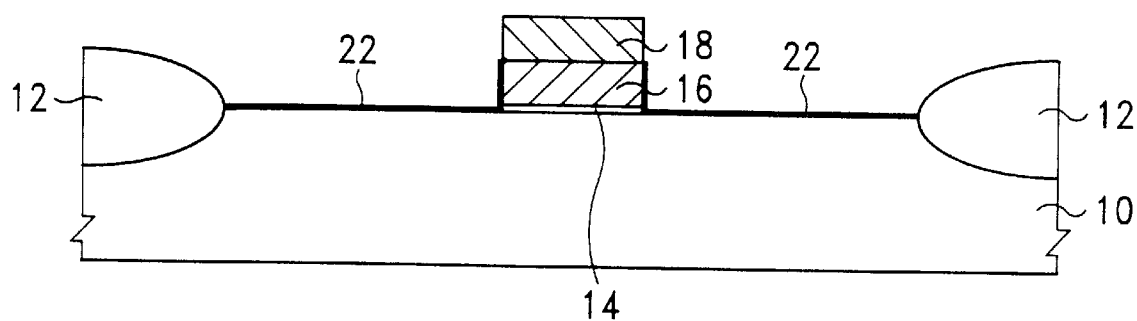
FIG. 3 illustrates a cross-sectional view of the formation of a shield layer over the semiconductor substrate, on the gate insulator layer, and on the first silicon layer in the present invention.

A gate region is formed by a series steps to remove a portion of the oxide layer 14, of the undoped polysilicon layer 16, and of the nitride layer 18, as shown in FIG. 2. A lithography and an etching process can be applied in doing the work. A photoresist layer 20 is formed and patterned for defining a gate pattern. The oxide layer 14, the undoped polysilicon layer 16, and the nitride layer 18 can be sequentially removed with a reactive ion etching (RIE) under the generation of plasma, using the gate pattern as a mask. The photoresist layer 20 is then removed after the gate region is defined.

A shield layer 22 is formed to recover the etching damage on the surface of the semiconductor substrate 10. The shield layer 22 is formed over the semiconductor substrate 10 and around the sidewall of the oxide layer 14 and of the undoped polysilicon layer 16. The shield layer 22 covering the oxide layer 14 can further reduce the penetration of undesired contamination into the oxide layer 14. The degradation of the oxide layer 14 which damages the device performance can be minimized. In this case, an oxynitride film thermally grown from the semiconductor substrate 10 and the undoped polysilicon layer 16 in a nitrogen and oxygen containing gas ambient, like a $N_2O$ or NO ambient, is used. The oxynitride film 22 is also grown around the oxide layer 14 by the diffusion of silicon through the oxide layer 14 from the semiconductor substrate 10. The thin oxynitride film can be grown with a ultra-thin thickness between about 5 angstroms to 100 angstroms.

Figure 4:
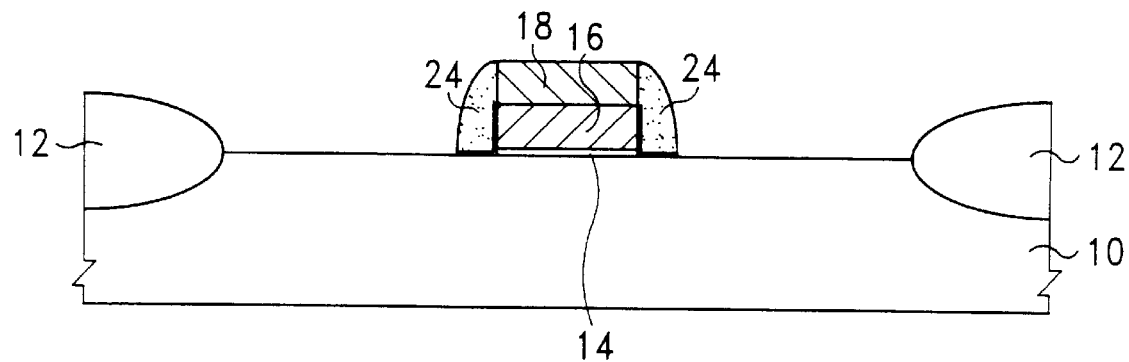
FIG. 4 illustrates a cross-sectional view of the formation of a spacer structure on the gate region in the present invention.
Figure 5:
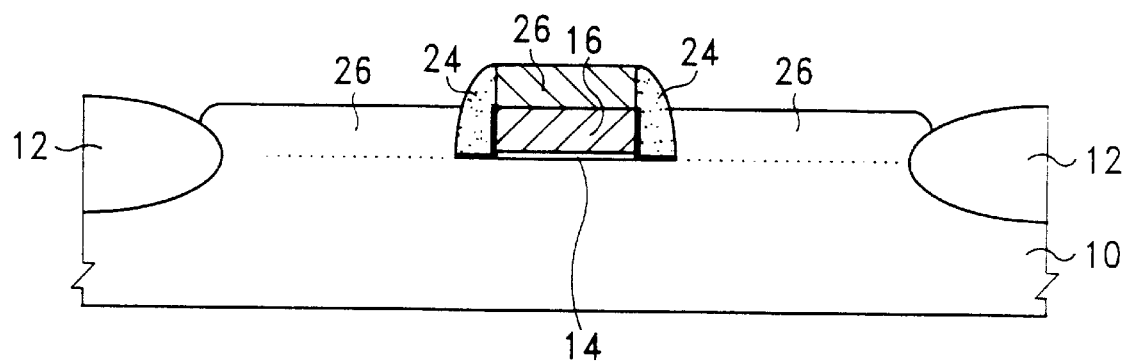
FIG. 5 illustrates a cross-sectional view of forming a second silicon layer over the semiconductor substrate and the first silicon layer in the present invention.

Referring to FIG. 4, a series of steps can be employed in forming a spacer structure 24 on the gate region. The spacer structure 24 is formed with first conductivity type dopants contained within. In the present embodiment, a boron-containing oxide or a boron-doped glass (BSG) can be used as the spacer structure 24. A BSG layer is deposited and etched off to form the BSG spacers. The doping concentration in the BSG spacers 24 is about $5E19$ atoms/cm$^3$ to about $5E22$ atoms/cm$^3$. A portion of the oxynitride film 22 uncovered by the BSG spacers 24 is also removed during the etching process. Followed with the formation of the BSG spacers 24, the nitride layer 18 within the BSG spacers 24 is removed, or etched off. Referring to FIG. 5, a second silicon layer 26 is formed over the semiconductor substrate 10 and the undoped polysilicon layer 16, with second conductivity type dopants contained within. Preferably, a boron doped silicon layer is employed. The boron doped silicon layer 26 can be formed in a chemical vapor deposition (CVD) with the introduction of boron containing gases. Preferably, a UHV (ultra high vacuum) CVD process is employed. The doping concentration in the doped silicon layer 26 is about $5E19$ atoms/cm$^3$ to about $5E22$ atoms/cm$^3$.

Figure 6:
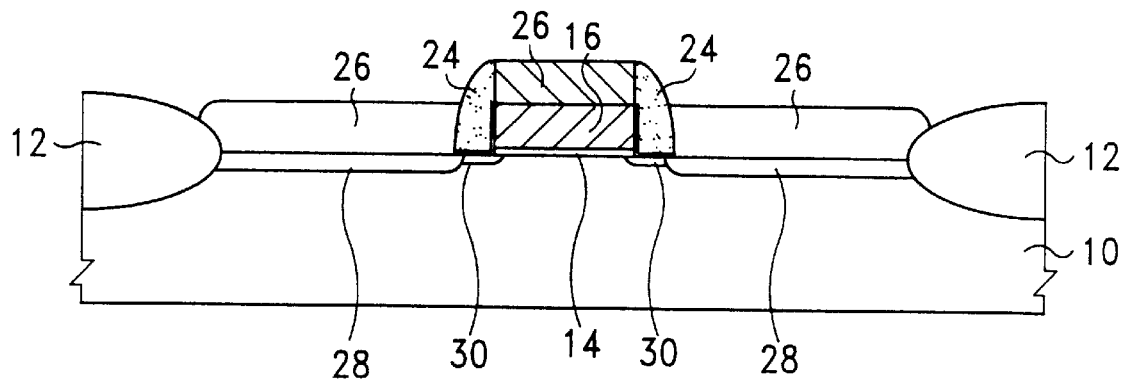
FIG. 6 illustrates a cross-sectional view illustrating the performance of a thermal process to diffuse the dopants into the semiconductor substrate in the present invention.

A portion of the boron doped silicon layer 26 within the spacer structure 24 is combined with the undoped polysilicon layer 16 to form a stacked gate structure. The conductivity of the gate structure can be maintained with the boron doped silicon layer 26. The degradation of the oxide layer 14 can be prevented by eliminating the possible boron penetration. Finally, a thermal process is performed to the semiconductor substrate. The boron dopants in the boron doped silicon layer 26 and the BSG spacers 24 are diffused to form respectively an ultra-shallow source/drain junction 28 and an extended source/drain junction 30, as shown in FIG. 6.

The details of the silicon-boron layer as a solid diffusion source can be acquired by referencing the investigation of T.

F. Lei et al. ("Low-Temperature Growth of Silicon-Boron Layer as Solid Diffusion Source for Polysilicon Contacted p$^+$-n Shallow Junction", IEEE Transactions on Electron Devices, Vol. 42, No. 12, 1995) In that work, it is found that the silicon-boron source diode has a much shallower junction and is less sensitive to thermal budget than the BF2$^+$ source diodes. A uniform ultra-shallow p$^+$-n junction can be obtained by using a thin silicon-boron layer as a diffusion source in their investigation.

A MOSFET with an elevated source/drain and solid phase diffused source/drain extension is formed by the method provided in the present invention. An elevated source/drain junction is formed with a ultra-shallow and uniform size by employing the boron doped silicon layer as a diffusion source. The short channel effects is greatly suppressed by using the elevated shallow junction. A stacked silicon layer structure is utilized as the gate structure to solve the problem of the degradation of the gate oxide. Thus the operational characteristics of the devices can be raised. The boron penetration problem is minimized with the protection of a shield layer. An extended ultra-shallow source/drain junction is formed by using the BSG spacers as a diffusion source. The unwanted effects accompanying the narrowed channel region of the small size devices are eliminated by the extended ultra-shallow junction.

As is understood by a person skilled in the art, the foregoing description of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a transistor over a semiconductor substrate, said method comprising the steps of:

forming a gate insulator layer having sidewalls over said semiconductor substrate;

forming a first silicon layer having sidewalls over said gate insulator layer;

forming an anti-reflection layer over said first silicon layer;

removing a portion of said gate insulator layer, of said first silicon layer, and of said anti-reflection layer for defining a gate region;

forming a shield layer over said semiconductor substrate and on said sidewalls of said gate insulator layer and on said sidewalls of said first silicon layer;

forming a spacer structure containing first conductivity type dopants on said gate region;

removing said anti-reflection layer;

forming a second silicon layer containing second conductivity type dopants over said semiconductor substrate and said first silicon layer; and performing a thermal process to said semiconductor substrate, for diffusing said first conductivity type dopants and said second conductivity type dopants into said semiconductor substrate.

2. The method of claim 1, wherein said semiconductor substrate comprises a silicon substrate.

3. The method of claim 1, wherein said gate insulator layer comprises a silicon oxide layer which is thermally grown in an oxygen containing ambient from said semiconductor substrate with a thickness of about 15 angstroms to 300 angstroms.

4. The method of claim 1, wherein said first silicon layer comprises an undoped polysilicon layer deposited with a thickness of about 300 angstroms to 2000 angstroms.

5. The method of claim 1, wherein said anti-reflection layer comprises a nitride layer formed by deposition.

6. The method of claim 1, wherein said removing said portion of gate insulator layer, of said first silicon layer, and of said anti-reflection layer comprises the steps of:

forming a photoresist layer over said anti-reflection layer;

defining a gate pattern on said photoresist layer; and performing a reactive ion etching (RIE) using said gate pattern as a mask, to remove said portion of gate insulator layer, of said first silicon layer, and of said anti-reflection layer to define said gate region.

7. The method of claim 1, wherein said shield layer comprises an oxynitride film grown thermally from said semiconductor substrate and said first silicon layer in a nitrogen and oxygen containing ambient, with a thickness between about 5 angstroms to about 100 angstroms.

8. The method of claim 1, wherein said spacer structure comprises boron doped glass (BSG), said first conductivity type dopants comprising boron.

9. The method of claim 1, wherein said second silicon layer comprises boron doped silicon, said second conductivity type dopants comprising boron.

10. The method of claim 9, wherein said boron doped silicon is deposited with a selective epitaxial process.

11. The method of claim 1, wherein said thermal process comprises a rapid thermal process (RTP) performed with a temperature between about 100° C. to about 1500° C. in order to diffuse said first conductivity type dopants to form an extended source/drain junction; and to diffuse said second conductivity type dopants to form a source/drain junction.

12. A method of forming a transistor over a semiconductor substrate, said method comprising the steps of:

forming a gate insulator layer having sidewalls over said semiconductor substrate;

forming a first silicon layer having sidewalls over said gate insulator layer;

forming an anti-reflection layer over said first silicon layer;

removing a portion of said gate insulator layer, of said first silicon layer, and of said anti-reflection layer for defining a gate region;

forming a shield layer over said semiconductor substrate and on said sidewalls of said gate insulator layer and on said sidewalls of said first silicon layer, said shield layer comprising an oxynitride film grown thermally from said semiconductor substrate and said first silicon layer in a nitrogen and oxygen containing ambient;

forming a boron doped glass (BSG) spacer structure on said gate region;

removing said anti-reflection layer;

forming a boron doped silicon layer over said semiconductor substrate and said first silicon layer; and performing a thermal process to said semiconductor substrate, for diffusing boron dopants in said BSG spacer structure and in said boron doped silicon layer, into said semiconductor substrate.

13. The method of claim 12, wherein said semiconductor substrate comprises a silicon substrate.

14. The method of claim 12, wherein said gate insulator layer comprises a silicon oxide layer which is thermally grown in an oxygen containing ambient from said semiconductor substrate with a thickness of about 15 angstroms to 300 angstroms.

15. The method of claim 12, wherein said first silicon layer comprises an undoped polysilicon layer deposited with a thickness of about 300 angstroms to 2000 angstroms.

16. The method of claim 12, wherein said anti-reflection layer comprises a nitride layer formed by deposition.

17. The method of claim 12, wherein said removing said portion of gate insulator layer, of said first silicon layer, and of said anti-reflection layer comprises the steps of:

forming a photoresist layer over said anti-reflection layer;

defining a gate pattern on said photoresist layer; and performing a reactive ion etching (RIE) using said gate pattern as a mask, to remove said portion of gate insulator layer, of said first silicon layer, and of said anti-reflection layer to define said gate region.

18. The method of claim 12, wherein said oxynitride film has a thickness between about 5 angstroms to about 100 angstroms.

19. The method of claim 12, wherein said boron doped silicon is deposited with a selective epitaxial process.

20. The method of claim 12, wherein said thermal process comprises a rapid thermal process (RTP) performed with a temperature between about 700° C. to about 1150° C.

to diffuse said boron dopants in said BSG spacer structure to form an extended source/drain junction; and to diffuse said boron dopants in said boron doped silicon layer to form a source/drain junction.

* * * * *